US006687275B2

(12) United States Patent
Lin

(10) Patent No.: US 6,687,275 B2
(45) Date of Patent: Feb. 3, 2004

(54) RESONATING CAVITY SYSTEM FOR BROADLY TUNABLE MULTI-WAVELENGTH SEMICONDUCTOR LASERS

(75) Inventor: Ching-Fuh Lin, Taipei (TW)

(73) Assignee: Arima Optoelectronics Corp., Tao-Yuan Hsien (TW)

( * ) Notice: Subject to any disclaimer, the term of this patent is extended or adjusted under 35 U.S.C. 154(b) by 9 days.

(21) Appl. No.: 10/249,748

(22) Filed: May 5, 2003

(65) Prior Publication Data

US 2004/0004979 A1 Jan. 8, 2004

(30) Foreign Application Priority Data

Jul. 4, 2002 (TW) .................................... 91114882 A

(51) Int. Cl.⁷ ................................................ H01S 3/16
(52) U.S. Cl. ............................ 372/42; 372/20; 372/23; 372/92; 372/99; 372/101; 372/102; 372/103
(58) Field of Search .......................... 372/42, 99, 101, 372/102, 103, 92, 20, 23

(56) References Cited

U.S. PATENT DOCUMENTS 5,377,212 A * 12/1994 Tatsuno et al. ............... 372/22
6,101,211 A * 8/2000 Wakabayashi et al. ...... 372/102
6,322,220 B1 * 11/2001 Sano et al. ................... 359/615

OTHER PUBLICATIONS

Ci–Ling Pan, Chi–Luen Wang, A Novel Tunable Dual–wavelength External–cavity Laser Diode Array and Its Applications, Optical and Quantum Electronics 8 (1996), pp. 1239–1257, Institute of Electro–Optical Engineering National Chiao Tung University, Hsinchu, 30010 Taiwan, ROC.

* cited by examiner

*Primary Examiner*—Quyen Leung
*Assistant Examiner*—Delma R. Flores-Ruiz
(74) *Attorney, Agent, or Firm*—Winston Hsu

(57) ABSTRACT

A resonating cavity system of a tunable multi-wavelength semiconductor laser. The system has a laser, a collimating lens, a grating, a slit plate, and adjustable mirrors. The laser has two ends. The first end is coupled to the cavity, and the second end outputs the laser beam. The grating is located in the lasing path between the first end of the semiconductor laser and the plate, and the plate is located before the adjustable mirrors. Each adjustable mirror is aligned to the corresponding slit of the plate. Lasing paths extend from the first end of the laser, through the grating, the lens, a plurality of the slits of the plate, to the adjustable mirrors. Each mirror can be adjusted independently to ensure each beam is reflected accurately back to each resonating path. Thereby, a feature of equal lasing gains of all the resonating paths is guaranteed.

12 Claims, 6 Drawing Sheets

RESONATING CAVITY SYSTEM FOR BROADLY TUNABLE MULTI-WAVELENGTH SEMICONDUCTOR LASERS

BACKGROUND OF INVENTION

1. Field of the Invention

The present invention relates to semiconductor cavity lasers, and more particularly, the present invention provides an improved cavity structure that uses a plurality of mirrors to separate reflection wavelengths.

2. Description of the Prior Art

Due to an arrival of an information age, using a broadband network and wavelength-division multiplexing (WDM) to provide high-capacity, high-speed data transmission has already become a trend. Traditionally, fiber-optic communication systems use wavelengths of 1.55 μm and 1.3 μm, because fiber loss and dispersion loss are minimized in these bands. Currently, a latest development in fiber-optic technology allows a significant reduction in hydroxyl absorption at 1.4 μm. Thus, fiber-optic communications already anticipate a bandwidth at 300 nm. So, it is imperative to provide a tunable laser source.

Since beginning research of multiple quantum well structures in 1974, design of super-crystalline structure semiconductor lasers has become a separate development trend. A high efficiency, a low threshold current, and an adjustable wavelength suggest the semiconductor lasers as optimal laser light sources for use in advanced optical systems. Recently, developments in multiple quantum well laser technology already provide very wideband light sources. With an addition of an external wideband tunable technology, a single-oscillation laser can be selected, e.g. a semiconductor optical amplifier. However, tunability of the semiconductor optical amplifier is limited by the traditional resonant cavity structure.

Currently there are many tunable wavelength laser technologies, such as a Fabry-Perot (FB) wavelength filter, a diffraction grating filter, a rotated thin-film filter, an electro-optic tunable filter, and a tunable fiber-grating filter. These wavelength tuning technologies are typically used for singl-wavelength oscillation, and aside from using grating technologies, are limited to a wavelength tuning range of under 100 nm. However, if the tunable cavity semiconductor laser uses a diffraction grating technology, the tunable range increases to over 200 nm.

Please refer to FIG. 1, which is a diagram of a resonant cavity structure 100 of a prior art tunable integrated semiconductor laser. The resonant cavity structure 100 comprises a grating 10, a collimating lens 11, and an FP semiconductor laser or a semiconductor optical amplifier (SOA) 13. The FP semiconductor laser or the SOA 13 comprises a waveguide 15 for propagating light waves, a first end facet and a second end facet. The first end facet is coated with an anti-reflective layer 12, and the second end facet has a cleavage. This type of resonant cavity structure is only suitable for single-wavelength oscillation design. After the laser light is produced by the FP laser or the SOA 13, the laser light is emitted from the anti-reflective layer 12, then the collimating lens 11 focuses the laser light into one parallel beam incident on the optical grating 10. A relationship between an angle of incidence θ i and an angle of reflection θ r of the beam can be given as:

$$\sin(\theta_r) = \sin(\theta_i) + m\lambda/\Lambda$$

where λ is a laser wavelength, Λ is a grating line spacing, and m is an integer.

When the selected laser wavelength is tuned to fit the condition θ i=θ r, the selected incident beam follows a path of the incident beam to reflect back to the collimating lens 11, then pass through the anti-reflective layer 12 into the FP laser or the SOA 13. This forms a single-wavelength oscillation path, and the output laser beam 14 is emitted through the second end face of the FP laser or the SOA 13.

Please refer to FIG. 2, which is a second prior art cavity structure 200 of a tunable semiconductor laser. The cavity structure 200 comprises a grating 20, a collimating lens 21 and an FP semiconductor laser or an SOA 23, which comprises a waveguide 26 for propagating light beams, a first end facet and a second end facet. The first end facet is coated with an anti-reflective layer, and the second end facet is coated with a high reflective layer 24. This type of resonant cavity structure is limited for use in single-wavelength oscillation designs. Unlike above, the laser beam is output by way of the grating 20, however the working principles are similar. After the laser light is produced by the FP laser or the SOA 23, the laser light may be reflected back by the high reflective layer 24, or directly pass through the anti-reflective layer 22. The laser light then passes the collimating lens 21, which collimates the laser light to become a parallel beam incident on the grating 20. The grating 20 thus separates the laser beam to become specific wavelength beam with an appropriate angle.

Please refer to FIG. 3. In a case of the laser beam being a dual-wavelength or multi-wavelength light source, the above two prior art tunable semiconductor laser cavity structures no longer fulfill the requirements. FIG. 3 is a diagram of a third prior art dual-wavelength resonant cavity structure 300 for a tunable semiconductor laser. The structure 300 comprises an optical grating 30, a first collimating lens 31, an SOA 32, a second collimating lens 33, a convex lens 34, a light tuning slit plate 35, and a reflector 36. The slit plate comprises a first slit 301 and a second slit 302. The optical grating 30 is set at a focal point of the convex lens 34. After the laser light source is produced by the SOA 32, the scattered light is sent through the collimating lens 31 to be focused into a parallel light beam incident on the grating 30. After being separated by the grating 30, a short-wavelength light beam 37 and a long-wavelength light beam 38 are produced, which are then sent through the convex lens 34 to become parallel light respectively incident upon the first and second slits 301,302 of the tuning slit plate 35. The beams are reflected back by the reflectors 36, thus forming two laser light resonance paths. A laser light beam 39 is sent through the second collimating lens 33 and output. Thus, the output laser beam is a dual-wavelength beam formed of the short-wavelength beam 37 and the long-wavelength beam 38. If the tuning slit plate 35 comprises further slits, by the same principle, a multi-wavelength laser beam could be produced. However, in the tunable semiconductor laser dual-wavelength cavity structure 300, it is difficult for the convex lens 34 to be accurately placed at a desired location between the optical grating 30 and the reflectors 36. If there is the slightest error in the position of the convex lens 34, not to mention the laser beam being incident on a non-ideal point on the grating 30, in either case it becomes impossible to collimate the two beams of different wavelengths. So, just using the single reflector 36 to ideally reflect the non-parallel light beams back to the resonance path is not possible. This causes non-uniform lasing loss in the dual-wavelength resonance cavity structure, and could be extended analogously to a multi-wavelength structure.

SUMMARY OF INVENTION

Thus, it is an objective of the claimed invention to provide a multi-wavelength tunable semiconductor laser structure that uses multiple reflectors to solve the above problems.

The structure of the claimed invention has a semiconductor optical amplifier (SOA), an optical grating, a convex lens, a light-tuning slit plate, and a plurality of tunable reflectors. The SOA has a first and a second end, the first end coupled to a resonance cavity, and the second end being a laser light output. The slit plate has a plurality of slits. The optical grating is set on a resonance path between the first end of the SOA and the slit plate. The slit plate is set in front of reflective sides of the plurality of tunable reflectors. The reflective sides of the plurality of tunable reflectors are aligned with the plurality of slits of the slit plate, respectively. The first end of the SOA through the optical grating, the convex lens, the plurality of slits of the light-tuning slit plate, to the reflective sides of the plurality of reflectors form a plurality of laser resonance paths. The plurality of tunable reflectors can independently be adjusted to different incidence angles, and are used to return non-parallel incident beams to lossless resonance paths.

It is an advantage of the claimed invention that the plurality of reflectors allows for precise tuning of multi-wavelength laser beams, reducing loss.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
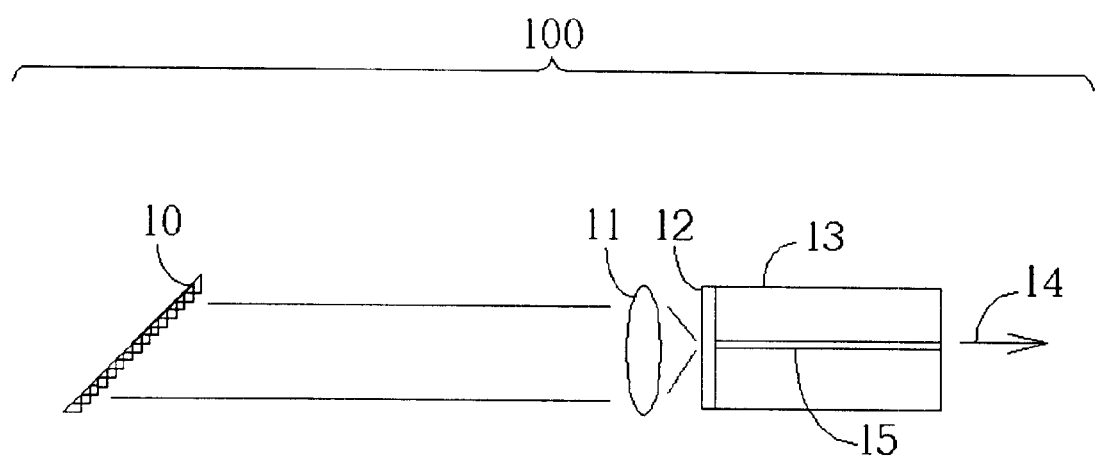
FIG. 1 is a diagram of a tunable semiconductor laser single-wavelength resonance cavity structure, according to the prior art.
Figure 2:
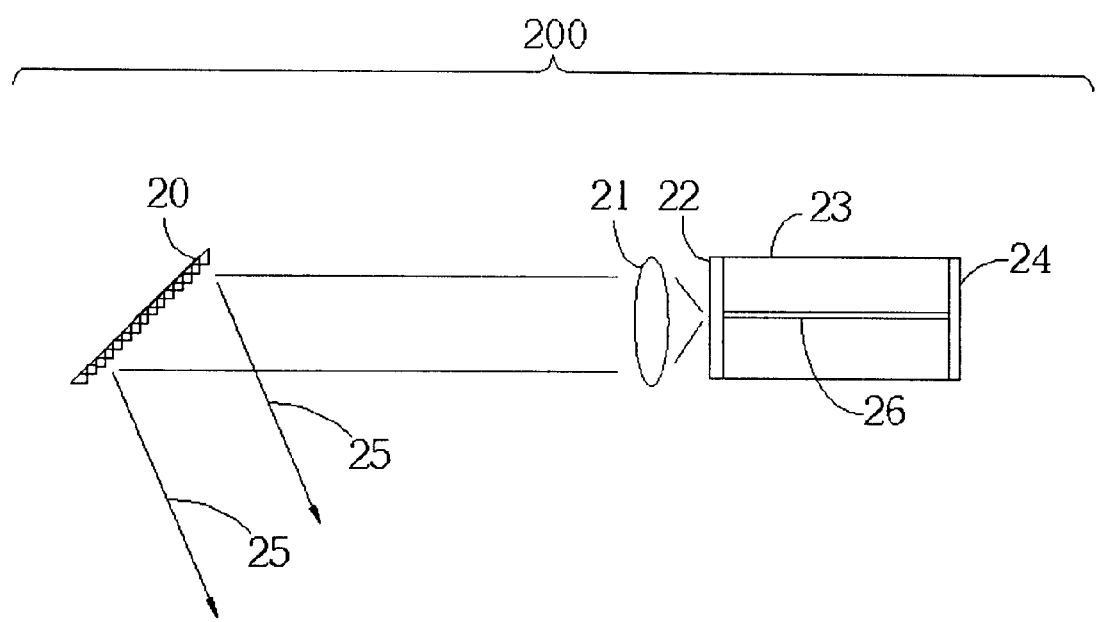
FIG. 2 is a diagram of a second tunable semiconductor laser single-wavelength resonance cavity structure, according to the prior art.
Figure 3:
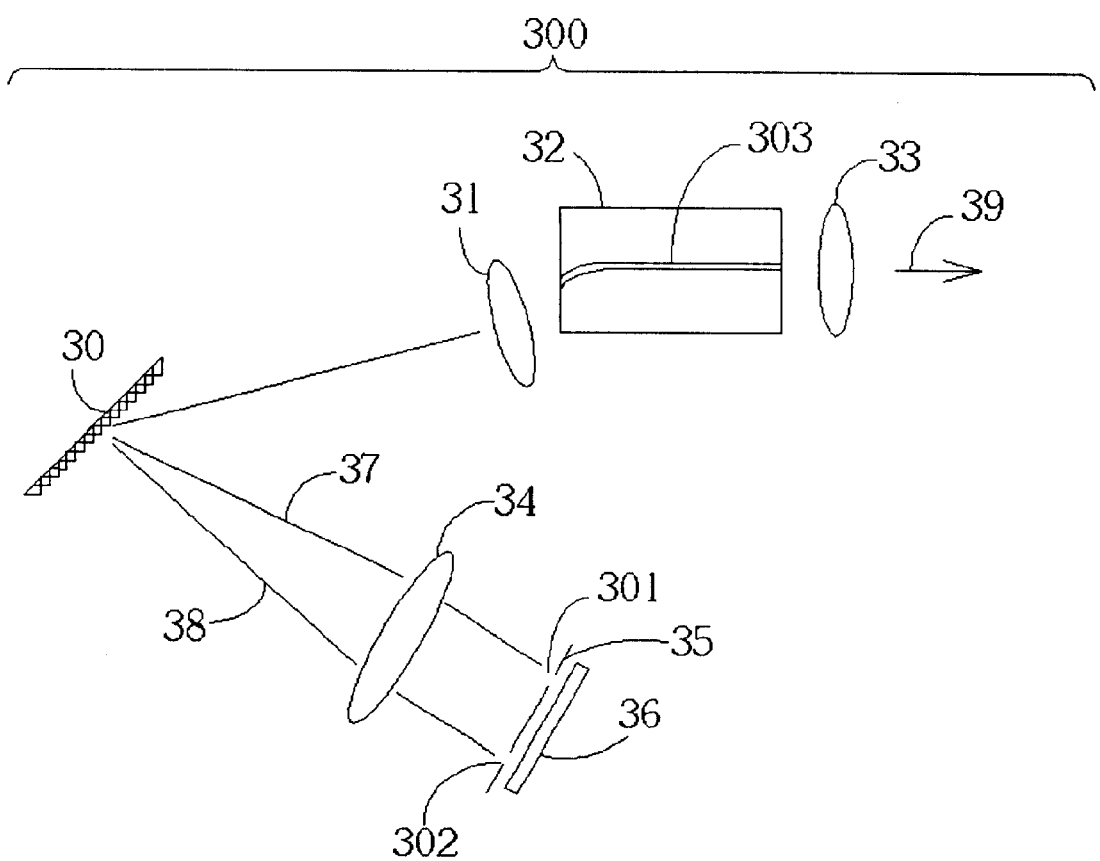
FIG. 3 is a diagram of a tunable semiconductor laser dual-wavelength resonance cavity structure, according to the prior art.
Figure 4:
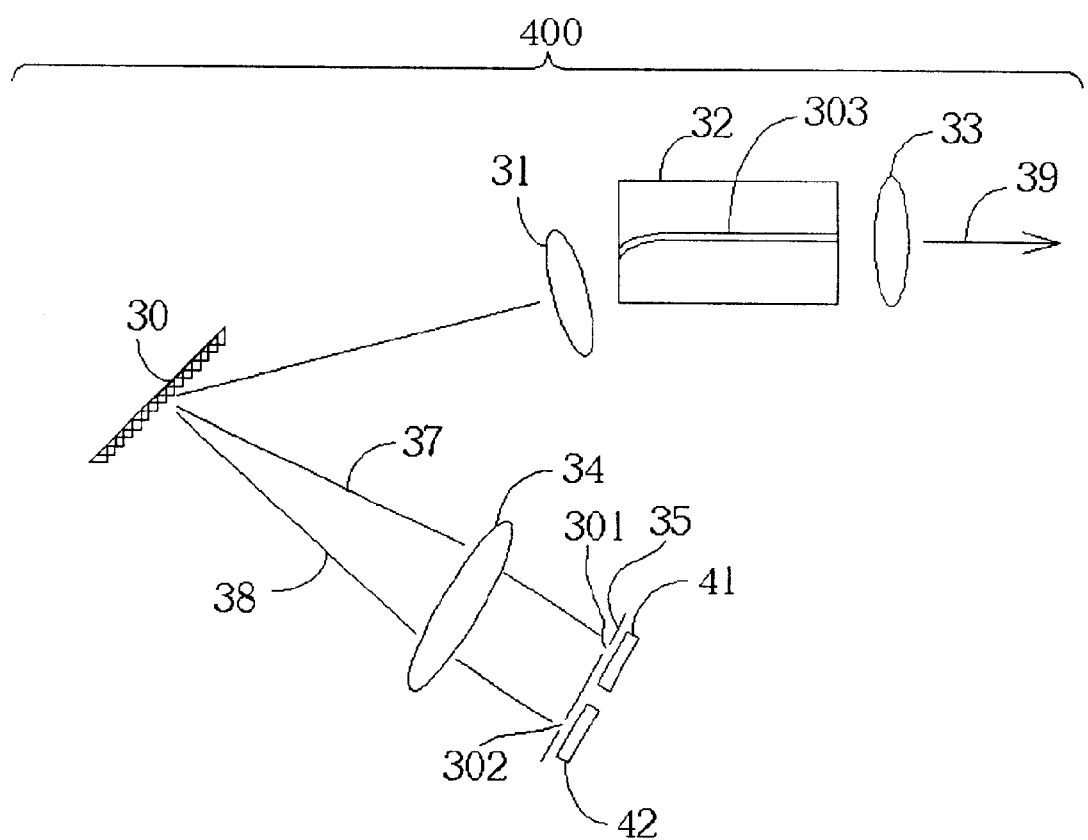
FIG. 4 is a diagram of a tunable semiconductor laser dual-wavelength resonance cavity structure, according to the present invention.

Please refer to FIGS. 3 and 4. FIG. 4 is a diagram of a tunable semiconductor laser dual-wavelength resonance cavity structure 400, which is an improved structure based on the dual-wavelength resonance cavity structure 300 of the prior art, described above. The resonance cavity structure 400 comprises an optical grating 30, a first collimating lens 31, a semiconductor optical amplifier (SOA) 32, a second collimating lens 33, a convex lens 34, a light-tuning slit plate 35, a first tunable reflector 41, and a second tunable reflector 42. The SOA 32 could be replaced with a multiple quantum well semiconductor laser, and comprises a curved waveguide 303 to avoid being formed as an internal resonant component of the semiconductor laser. The slit plate 35 comprises a first slit 301 and a second slit 302. The grating 30 is set at a focal point of the convex lens 34. The first and the second tunable reflectors 41,42 could be tiny reflectors of an optical micro-electro-mechanics system, or digital micro-mirror devices of a digital light processing (DLP) system, and are controlled by two groups of independent actuators (not shown). After the laser light is produced by the SOA 32, the scattered light is collimated by the collimating lens 31 to become a parallel beam incident on the grating 30. After passing the grating 30, the beam becomes a short-wavelength beam 37 and a long-wavelength beam 38. The short- and long-wavelength beams 37,38 pass the convex lens 34 to be incident upon the first and second slits 301,302 of the slit plate 35, respectively. Then, the beams 37,38 are reflected back by the first and the second reflectors 41,42, respectively, forming two laser light lasing paths. Finally, a laser beam 39, formed of the short- and long-wavelength beams 37,38 is output through the second collimating lens 33. If the convex lens 34 cannot be accurately placed at a location between the first and second reflectors 41,42 and the grating 30, namely, when the convex lens 34 has a slight error in its placement, and the short- and long-wavelength beams 37,38 cannot become parallel light beams, at this time, the first and second reflectors 41,42, whose angles can be adjusted independently, can be used to reflect the two light beams to the original minimum-loss lasing paths. This solves the non-uniform lasing loss problem and misalignment of the traditional dual-wavelength resonance cavity.

Figure 5:
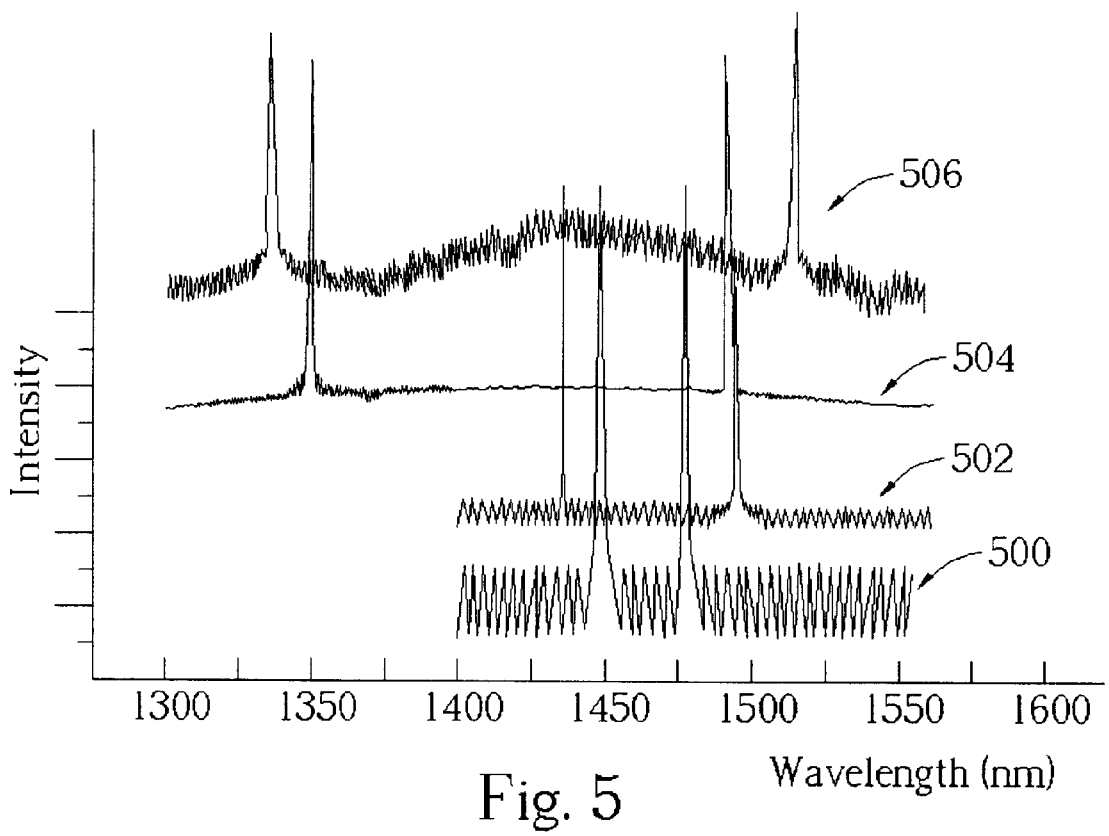
FIG. 5 is a spectroscopy of the dual-wavelength resonance cavity structure of FIG. 4.

Please refer to FIG. 5, which is a spectroscopy of the dual-wavelength resonance cavity structure of FIG. 4. The horizontal axis represents the output laser light wavelength. The vertical axis represents the relative light intensity of the output laser spectroscopy. Adjusting the positions and separations of the first and second slits 301,302 of the light-tuning slit plate 35 causes different laser lasing paths, and thus, different laser wavelengths. FIG. 5 shows four different laser spectroscopys 500, 502, 504, 506 corresponding to four different slit separations of 32 nm, 63 nm, 138 nm, and 170 nm respectively. And, with the help of the independently tunable first and second reflectors 41,42, which losslessly reflect the resonant light beams along the original lasing paths, as shown in FIG. 5, the light beams have very high signal-to-noise ratios (SNR). And, the intensities of the selected dual-wavelength light beams are almost exactly the same. In other words, the present invention dual-wavelength resonance cavity structure provides extremely uniform dual-wavelength lasing characteristics.

Figure 6:
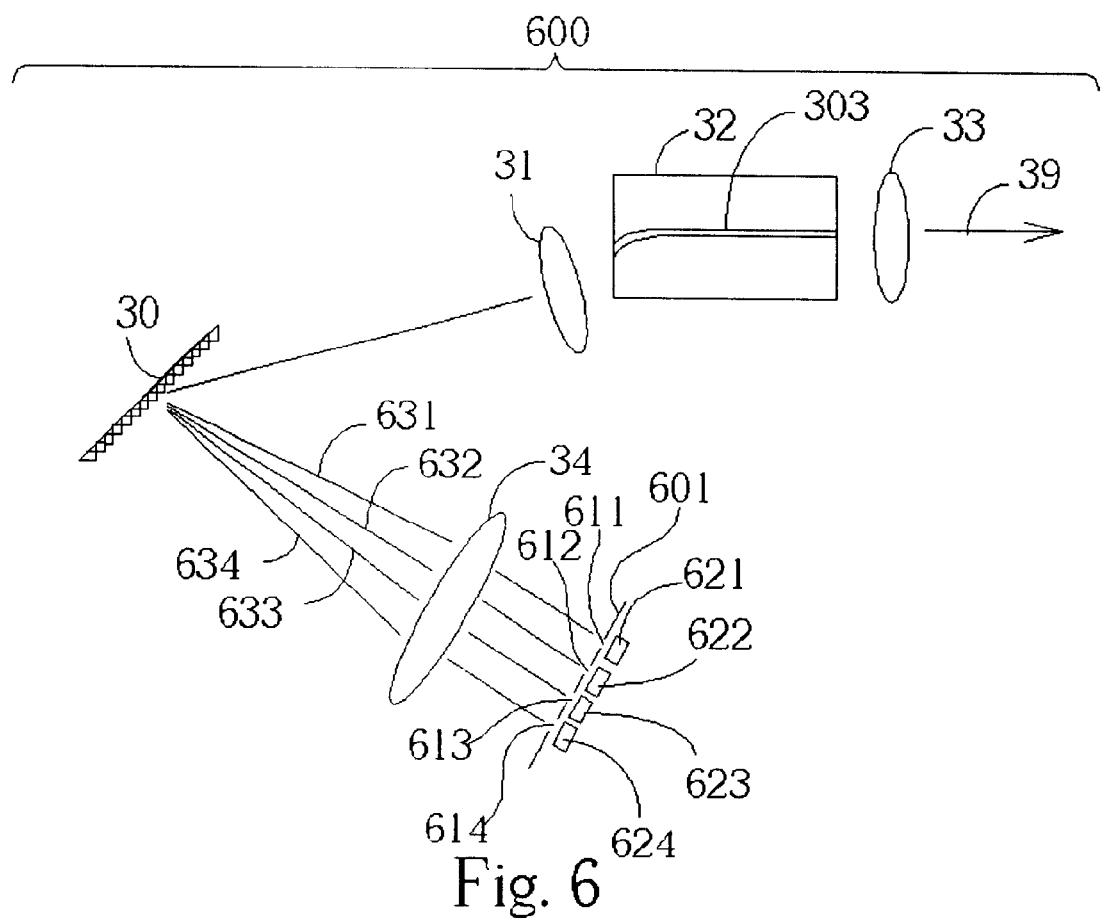
FIG. 6 is a tunable semiconductor laser four-wavelength resonance cavity structure, according to the present invention.

Please refer to FIGS. 3 and 6. FIG. 6 is a tunable semiconductor laser four-wavelength resonance cavity structure 600, and improves upon the prior-art structure 300 described above. The resonance cavity structure 600 comprises an optical grating 30, a first collimating lens 31, an SOA 32, a second collimating lens 33, a convex lens 34, a light-tuning slit plate 601, a first tunable reflector 621, a second tunable reflector 622, a third tunable reflector 623, and a fourth tunable reflector 624. The SOA 32 comprises a curved waveguide 303 for avoiding being formed as an internal resonating component of the semiconductor laser. The slit plate 601 comprises a first slit 611, a second slit 612, a third slit 61 3, and a fourth slit 614. The optical grating 30 is set at a focal point of the optical grating 30. The four tunable reflectors 621-4 can be tiny reflectors of a MEMS or digital micro-mirror objects of a DLP system, and are controlled by four groups of independent actuators (not shown). After the laser light source is produced by the SOA 32, the scattered light is collimated by the collimating lens 31 to become a parallel beam incident on the grating 30. After passing the grating 30, the beam becomes a first-wavelength beam 631, a second-wavelength beam 632, a third-wavelength beam 633, and a fourth-wavelength beam 634. The four beams 631-4 pass the convex lens 34 to be incident upon the first, second, third and fourth slits 611, 612,613,614 of the slit plate 601, respectively. Then, the beams 631-4 are reflected back by the first, second, third and fourth reflectors 621-4, respectively, forming four laser light lasing paths. Finally, a laser beam 39, formed of the four beams 631-4, is output through the second collimating lens 33. If the convex lens 34 cannot be accurately placed between the four tunable reflectors 621-4 and the optical grating 30, namely, when the position of the convex lens 34 has an error, and the four laser beams 631-4 cannot become parallel beams, at this time, the four tunable reflectors 621-4, whose angles can be adjusted independently, can be used to reflect the four resonant light beams 631-4 losslessly along the original lasing paths. This solves the non-uniform lasing loss and misalignment of the prior art four-wavelength resonance cavity structure, and could be extended to higher multiplicity cavity structures in the present invention.

As described above, compared with the prior art, which only uses one reflector, the present invention tunable semi-conductor multi-wavelength resonance cavity structure uses a plurality of reflectors to target a plurality of lasing paths. The plurality of reflectors have independently adjustable angles, and are used to return laser beams to original minimum-loss lasing paths. In addition, it provides the possibility for each desired wavelength to have well-aligned optical path, thus solving the lasing loss and misalignment problems of the prior art.

Those skilled in the art will readily observe that numerous modifications and alterations of the structure may be made while retaining the teachings of the invention. Accordingly, the above disclosure should be construed as limited only by the metes and bounds of the appended claims.

What is claimed is:

1. A laser resonance cavity structure comprising:

a light source for producing light, an optical grating for diffracting rays sent from the light source, and reflecting the rays at different angles; and a plurality of reflectors for reflecting the rays sent from the optical grating;

a fixture between the optical grating and the plurality of reflectors including a plurality of slits for selecting desired wavelength components;

wherein the plurality of reflectors reflect the rays sent from the optical grating back to the optical grating, and by way of the optical grating back to the light source to be output as a lased light beam.

2. The structure of claim 1 wherein the fixture is a plate, the slits being aligned with the plurality of reflectors, and used for allowing light rays of only specific wavelengths to be sent to the plurality of reflectors.

3. The structure of claim 1 further comprising a convex lens between the optical grating and the fixture, for focusing light beams reflected from the optical grating to the plurality of reflectors through the slits of the fixture.

4. The structure of claim 1, wherein the light source comprises a waveguide for guiding the light rays produced by the light source, the waveguide comprising a first end and a second end.

5. The structure of claim 4 wherein the waveguide is a curved waveguide.

6. The structure of claim 4 wherein the first end of the waveguide comprises an anti-reflective layer for preventing a light ray sent through the waveguide to the first end from being reflected directly back to the waveguide by the first end.

7. The structure of claim 4 further comprising a collimating lens set at an end of the waveguide, for collimating light rays scattered by the waveguide.

8. The structure of claim 7 wherein the collimating lens is set between the light source and the optical grating, for collimating the light rays scattered by the waveguide onto the optical grating.

9. The structure of claim 7 wherein the collimating lens is set on a side of the second end of the waveguide, for collimating and outputting light rays of the light source.

10. The structure of claim 9 wherein light rays collimated by the collimating lens are laser light.

11. The structure of claim 1 wherein the light source is a semiconductor optical amplifier.

12. The structure of claim 1 wherein the light source is a multi-quantum well semiconductor laser.

\* \* \* \* \*